(12) United States Patent
Gruber et al.

(10) Patent No.: US 6,227,115 B1
(45) Date of Patent: *May 8, 2001

(54) IGNITION DEVICE FOR TRIPPING A PASSENGER RESTRAINT DEVICE IN A MOTOR VEHICLE

(75) Inventors: Robert Gruber, Regensburg; Christian Plankl, Burgweinting; Markus Christoph, Regensburg; Josef Dirmeyer, Bodenwöhr; Egbert Wagner, Sinzing; Heinrich Probst, Tegernheim, all of (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/157,703

(22) Filed: Sep. 21, 1998

Related U.S. Application Data

(63) Continuation of application No. PCT/DE97/00475, filed on Mar. 11, 1997.

(30) Foreign Application Priority Data

Mar. 19, 1996 (DE) .............................................. 196 10 799

(51) Int. Cl.⁷ ...................................................... F42B 3/12
(52) U.S. Cl. ................................... 102/202.9; 102/202.7; 102/202.14; 102/530; 102/202.1; 280/741
(58) Field of Search ........................... 102/202.5, 202.14, 102/202.12, 275.12, 275.11, 206, 217, 202.1, 202.2, 202.7, 202.8, 202.9; 280/735, 741

(56) References Cited

U.S. PATENT DOCUMENTS

| | | | |
|---|---|---|---|
| 4,271,453 | * 6/1981 | Yajima et al. | 361/248 |
| 4,712,477 | * 12/1987 | Aikou et al. | 102/206 |
| 4,869,170 | * 9/1989 | Dahmberg et al. | 102/202.5 |
| 4,973,859 | * 11/1990 | Shodai | 307/10.1 |
| 5,142,982 | * 9/1992 | Diepold et al. | 102/202.5 |
| 5,200,574 | * 4/1993 | Cunningham et al. | 102/530 |
| 5,460,093 | * 10/1995 | Prinz et al. | 102/217 |
| 5,529,338 | * 6/1996 | Thompson | 280/741 |
| 5,616,881 | * 4/1997 | Hansen | 102/202.4 |
| 5,634,660 | * 6/1997 | Fink et al. | 280/741 |
| 5,648,634 | * 7/1997 | Avory et al. | 102/202.1 |
| 5,662,353 | * 9/1997 | Bergerson et al. | 280/737 |
| 5,728,599 | * 3/1998 | Rostoker et al. | 437/182 |
| 5,751,553 | * 5/1998 | Clayton | 361/749 |
| 5,800,958 | * 9/1998 | Manteghi | 438/123 |
| 5,847,310 | * 12/1998 | Nagahashi et al. | 102/202.6 |
| 5,889,228 | * 3/1999 | Ewick et al. | 102/202.5 |
| 6,070,531 | * 6/2000 | Hansen et al. | 102/202.7 |

FOREIGN PATENT DOCUMENTS

| | | |
|---|---|---|
| 8901560.6 | 4/1990 | (DE) . |
| 4300342A1 | 7/1994 | (DE) . |
| 4414743A1 | 11/1994 | (DE) . |
| 4339347A1 | 5/1995 | (DE) . |
| 19510428A1 | 9/1995 | (DE) . |
| 0471871A1 | 2/1992 | (EP) . |
| 2245775A | 1/1992 | (GB) . |

* cited by examiner

Primary Examiner—Harold J. Tudor
(74) Attorney, Agent, or Firm—Herbert L. Lerner; Laurence A. Greenberg; Werner H. Stemer

(57) ABSTRACT

A detonator device for tripping a passenger restraint device in a motor vehicle includes a detonator circuit on a holder. Firing pins for receiving a detonator element are an integral component of the holder.

8 Claims, 7 Drawing Sheets

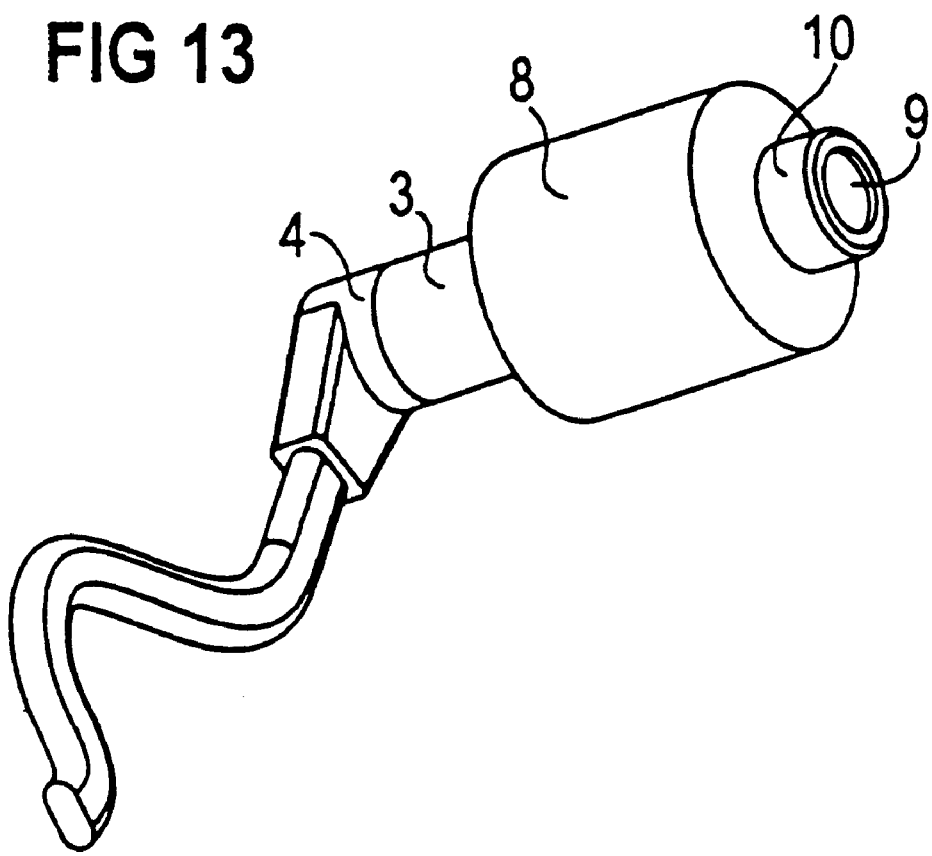

IGNITION DEVICE FOR TRIPPING A PASSENGER RESTRAINT DEVICE IN A MOTOR VEHICLE

CROSS-REFERENCE TO RELATED APPLICATION

This is a continuation of copending International Application PCT/DE97/00475, filed Mar. 11, 1997, which designated the United States.

BACKGROUND OF THE INVENTION

Field of the Invention

The invention relates to a detonator device having a detonator circuit for tripping a passenger restraint device in a motor vehicle.

One system for tripping a passenger restraint device in a motor vehicle is known from European Patent Application EP 0 471 871 A1. The system has an evaluation unit, disposed centrally in the vehicle, for evaluating acceleration and crash signals that are furnished by a sensor device. Detonator devices that include detonator circuits are disposed near the associated passenger restraint devices, such as an air bag, belt tensioner, and so forth, are connected to the evaluation unit via a line/bus. If the evaluation unit detects an accident in which at least one of the passenger restraint devices should be tripped, then an encoded trip command is sent from the evaluation unit to the corresponding detonator device. In the detonator circuit of the detonator device, the trip command is decoded and converted into control commands, by which the energy, stored in an energy-storing capacitor of the detonator device, is transmitted to a passenger restraint device detonator element/primer capsule that is electrically connected to the detonator device.

A conventional detonator element in the form of a primer capsule has two firing pins that are connected via a detonator wire. The detonator wire is disposed in a firing chamber, which is formed by both a holder of the primer capsule and a plastic cap. The firing chamber is filled with a detonating powder, which when the detonator wire heats up sufficiently explodes and blows off the lid of the plastic cap. The sheath of the plastic cap is surrounded by a metal cap that is intended to prevent electromagnetic radiation into the firing pins and detonator wire. A lower part of a gas generator sheath surrounds the primer capsule and at the same time forms a plug body for the firing pins. The gas generator sheath surrounds a generator chamber, in which capsules are disposed that are supplied with energy by the explosion of the detonating powder and thereupon release gases which fill an air bag connected to the gas generator. via the plug connection, the primer capsule is electrically conductively connected to an evaluation unit disposed centrally in the vehicle, and for tripping the associated passenger restraint device, a firing pulse that carries sufficient energy is transmitted via a line between the evaluation unit and the primer capsule.

The known primer capsule typically has a short-circuit bridge disposed between the firing pins. Such a short-circuit bridge prevents unintended detonation of the detonating powder, by unintentional application of a direct voltage to the firing pins protruding from the plug body, before a mating plug is plugged into the primer capsule.

SUMMARY OF THE INVENTION

It is accordingly an object of the invention to provide an ignition device for tripping a passenger restraint device in a motor vehicle which overcomes the above-mentioned disadvantages of the prior art devices of this general type, in which an extremely small in size tripping device is provided, so that it can be accommodated in a steering wheel, for instance, and moreover needs only a small number of components and is simple to produce.

With the foregoing and other objects in view there is provided, in accordance with the invention, a detonator device for tripping a passenger restraint device in a motor vehicle, including: a detonator circuit; and a holder housing the detonator circuit, the holder having firing pins for receiving a detonator element.

A holder containing the detonator circuit has firing pins for receiving the detonator element. A detonator element connected to the detonator device has substantially the same configuration as the known primer capsule, except that instead of the firing pins protruding from the body of the primer capsule, bushes are provided for receiving the firing pins, which are now secured to the detonator device. According to the invention, the detonator device accordingly includes a preferably three-dimensional circuit holder with which at least the firing pins are integrated.

The short-circuit clip of conventional primer capsules can thus be dispensed with.

The detonator wire, typically embodied as an incandescent filament, is preferably secured directly to the firing pins protruding from the circuit holder. The primer capsule as a structural unit to be slipped onto the detonator device is thus dispensed with. The firing pins are in any case, according to the invention, an integral component of the circuit holder that receives the detonator circuit. In this advantageous feature as well, the short-circuit clip, which particularly in conventional primer capsules is indispensable for the sake of nonhazardous handling, is then omitted. According to the invention, the primer capsule and the detonator device are no longer connected electrically and mechanically to one another via a plug connection. The firing pins, as an integral component of the circuit holder of the detonator device, are produced jointly with the holder, and at the same time.

Not until a further step is the detonator wire pressed, soldered, or glued to the firing pins, or simply wrapped around them (wire-wrap binding). The firing chamber, defined as the surroundings of the detonator wire, is thereupon filled with pyrotechnical detonating powder.

The detonator device preferably includes plug pins, which are also an integral component of the holder. via these plug pins and a corresponding plug connector, the detonator device is connected via a bus to the evaluation unit. If a voltage is mistakenly applied to the plug pins of the detonator device before the detonator device is connected to the evaluation unit, then the detonator wire, because of the detonator circuit connected upstream of the firing pins, is not heated and thus prevents inadvertent tripping of the passenger restraint. Because the firing pins and the circuit holder are a structural unit, it becomes unnecessary to provide a short-circuit clip between the firing pins.

Space is also saved by omitting a plug connection between a conventional primer capsule and a conventional detonator device that lacks integrated firing pins.

In an especially advantageous feature of the invention, the holder is embodied as a conductor track structure stamped out of a metal strip, and the firing pins are embodied integrally with the conductor track structure. Because of an advantageous three-dimensional form of the conductor track structure and because the plug pins and the conductor track structure are likewise embodied integrally, the overall detonator device becomes extremely compact. Therefore, there is space for housing the holder even in the steering wheel or in the side door of the vehicle.

In a further advantageous feature of the invention, the holder is embodied as a three-dimensional plastic body with applied conductor tracks, and the firing pins are firmly joined to the plastic body, preferably by being spray-coated, and are thus inseparably joined to the plastic body. In terms of the compactness of the detonator device, it is also advantageous here to embody the plug pins from the outset as an integral component of the holder. The advantages of this feature are the same as those of the feature of the invention described above.

The three-dimensional circuit holder allows configuration freedom for the entire detonator device in terms of its three-dimensional construction, and can thus be adapted extremely simply, not only to the spatial characteristics of the installation site, but also to both the mechanical interfaces with the gas generator and the plug interface with the bus.

In accordance with an added feature of the invention, there is a detonator wire electrically connecting the firing pins.

In accordance with an additional feature of the invention, there is a plastic sheath surrounding the holder.

In accordance with another feature of the invention, there is a metal sheath surrounding the holder.

In accordance with a further added feature of the invention, the holder has a metallized surface and a spacing between the metal sheath and the metallized surface of the holder is less than a spacing between the metal sheath and the firing pins.

In accordance with a concomitant feature of the invention, the firing pins are an inseparable component of the holder.

Other features which are considered as characteristic for the invention are set forth in the appended claims.

Although the invention is illustrated and described herein as embodied in an ignition device for tripping a passenger restraint device in a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 13 is a perspective view of the assembled detonator device with the mating plug and sheaths shown in FIG. 12.

DESCRIPTION OF THE PREFERRED EMBODIMENTS

Figure 1:
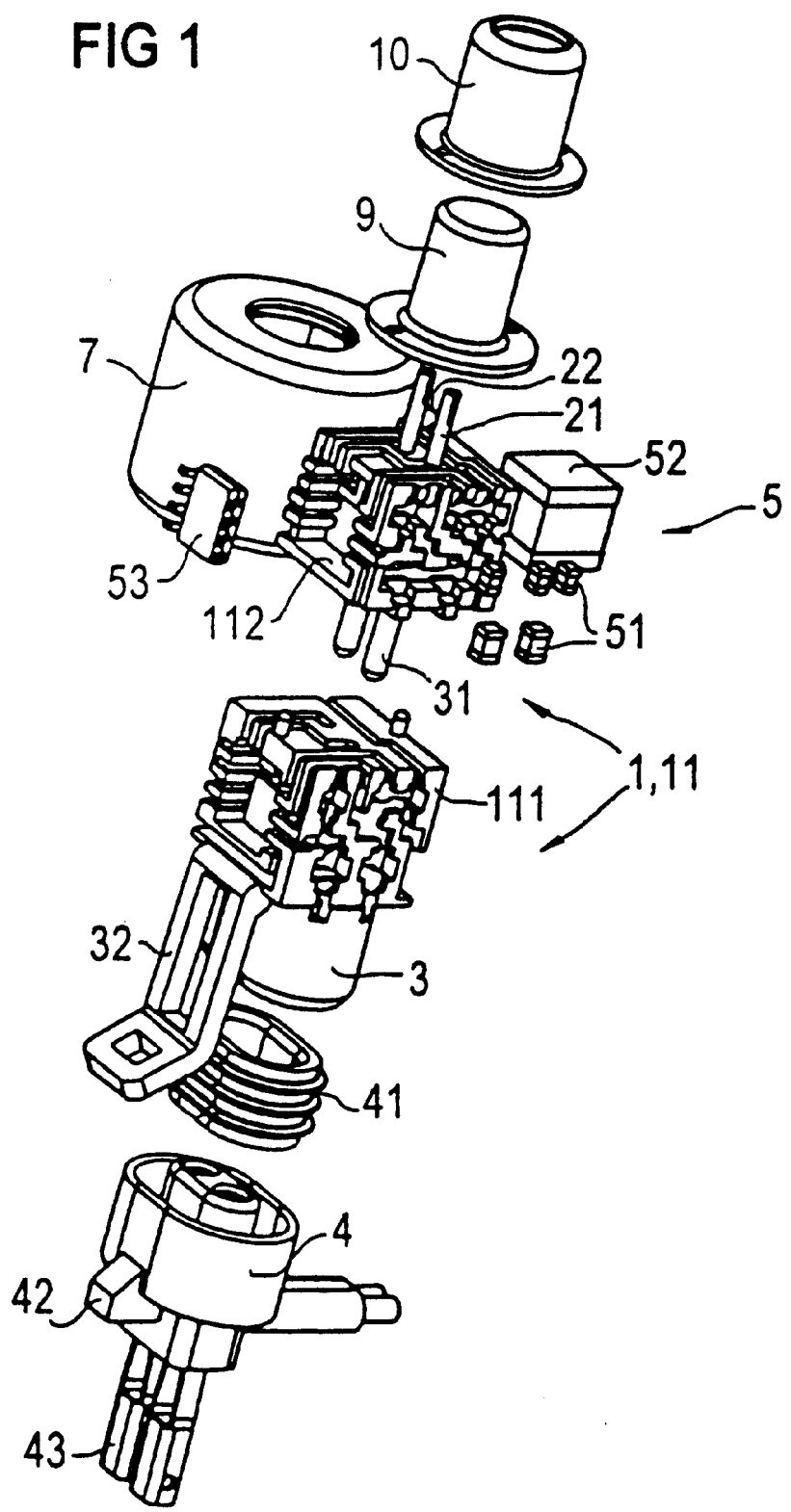
FIG. 1 is an exploded, perspective view of a detonator device with a mating plug and various sheaths according to the invention.

Identical elements/components in the drawings are identified by the same reference numerals throughout the figures. Referring now to the figures of the drawing in detail and first, particularly, to FIG. 7 thereof, there is shown a conventional detonator element in the form of a primer capsule 2 having two firing pins 21, which are connected via a detonator wire 22. The detonator wire 22 is disposed in a firing chamber 23, which is formed by both a holder of the primer capsule 2 and a plastic cap 9. The firing chamber 23 is filled with a detonating powder. When the detonator wire 22 heats up sufficiently, the detonating powder explodes and blows off the lid of the plastic cap 9. The sheath of the plastic cap 9 is surrounded by a metal cap 10, which is intended to prevent electromagnetic radiation into the firing pins 21 and detonator wire 22. A lower part of a gas generator sheath 6 surrounds the primer capsule 2 and at the same time forms a plug body 3 for the firing pins 21. The gas generator sheath 6 surrounds a generator chamber 61, in which non-illustrated capsules are disposed that are supplied with energy by the explosion of the detonating powder and thereupon release gas which fill an air bag connected to the gas generator. Via the plug connection, the primer capsule 2 is electrically conductively connected to an evaluation unit disposed centrally in the vehicle, and for tripping the associated passenger restraint device, a firing pulse that carries sufficient energy is transmitted via a line between the evaluation unit and the primer capsule 2.

Figure 7:
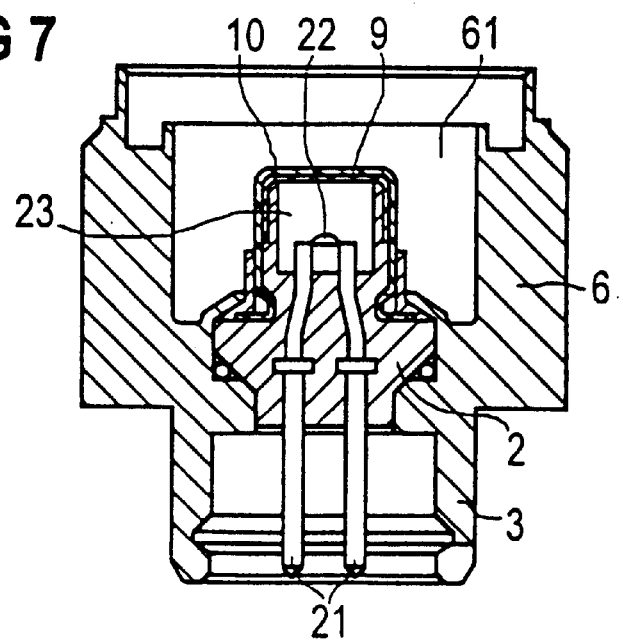
FIG. 7 is a sectional-view through a prior art primer capsule surrounded by a lower gas generator part.

The known primer capsule typically has a short-circuit bridge, not shown in FIG. 7, disposed between the firing pins 21. Such a short-circuit bridge prevents an unintended detonation of the detonating powder by an unintentional application of a direct voltage to the firing pins 21 protruding from the plug body 3 before a mating plug is plugged into the primer capsule 2.

In FIG. 1 there is shown an exploded view of a detonator device with various sheaths 7, 9, 10 and a mating plug 4 according to the invention. The detonator device includes a circuit holder 1, which is embodied as a three-dimensional plastic body 11. The three-dimensional plastic body 11 is made from plastic components including an insulating body 111 having a first plastic component forming a skeleton of the plastic body 11. A conductor track body 112 is injected around the insulating body 111 as a further plastic component. That is, the insulating body 111 and conductor track body 112 of FIG. 1 are not thrust one into the other but instead supplement one another in the sense that the conductor track body 112 is sprayed onto the insulating body 111. In contrast to the first plastic component, the further plastic component, from which the conductor track body 112 is made, has the property that its surface can be metallized. In a further production step, the surfaces of the conductor track body 112 that are accessible on the plastic body 11 are thus metallized to form conductor tracks 113 (see FIG. 2).

Instead of the two-component injection molding of the plastic body 11 as described above, the plastic body 11 may also be injection-molded from a single plastic component. After that, the conductor tracks 113 are then applied to the plastic body 11 by exposure to direct laser light, 3D mask exposure, or hot-stamping.

The resultant plastic body 11 is the circuit holder 1 for a detonator circuit 5. The detonator circuit 5 is equipped with electronic components, such as an energy-storing capacitor 52 and an integrated circuit 53. The components, like other components 51, may be embodied as SMDs (surface mounted devices), thus enabling SMD assembly of the circuit holder 1 with a standard SMD assembly robot. The plug body 3 for receiving the mating plug 4 is jointly sprayed onto the insulating body 111. The mating plug 4 has a detent lug 42 for locking in a detent fashion in a detent hook 32 of the plug body 3, which is also made together with the insulating body 111 in a single injection-molding operation. A silicone sealing ring 41 seals off the plug body 3 and the mating plug 4 from water. The plug connection 3, 4 can be additionally locked by locking elements 43.

Plug pins 31, which are at least partly surrounded by the plug body 3, and the firing pins 21 which are at least partly embedded in the plastic body 11 and are thus inseparably joined to it. The firing pins 21 are electrically conductively joined to one another via the detonator wire 22. The part of the firing pins 21, including the detonator wire 22, that protrudes from the plastic body 11 is surrounded by the plastic cap 9 and also by the metal cap 10. The plastic cap 9 serves to hold detonating powder, which when the detonator wire 22 heats up sufficiently explodes.

The metal cap 10 guards both the firing pins 21 and the detonator wire 22 against electromagnetic radiation. The metal cap 10 has no lid, and thus when the detonating powder in the plastic cap 9 explodes, the lid of the plastic cap 9 is blasted away, and the energy released can escape through the metal cap 10. Conversely, electromagnetic radiation furnished via the plug pins 31 is filtered out by suitable circuitry elements of the detonator circuit 5.

In the assembled state of the detonator device, the plastic sheath 7 surrounds the circuit holder 1 and in particular protects it against moisture, water and gases and the attendant oxidation/corrosion. Preferably the plastic body 11/circuit holder 1, equipped with components 51–53, is spray-coated with an insulating plastic, thus creating the plastic sheath of FIG. 1.

Figure 2:
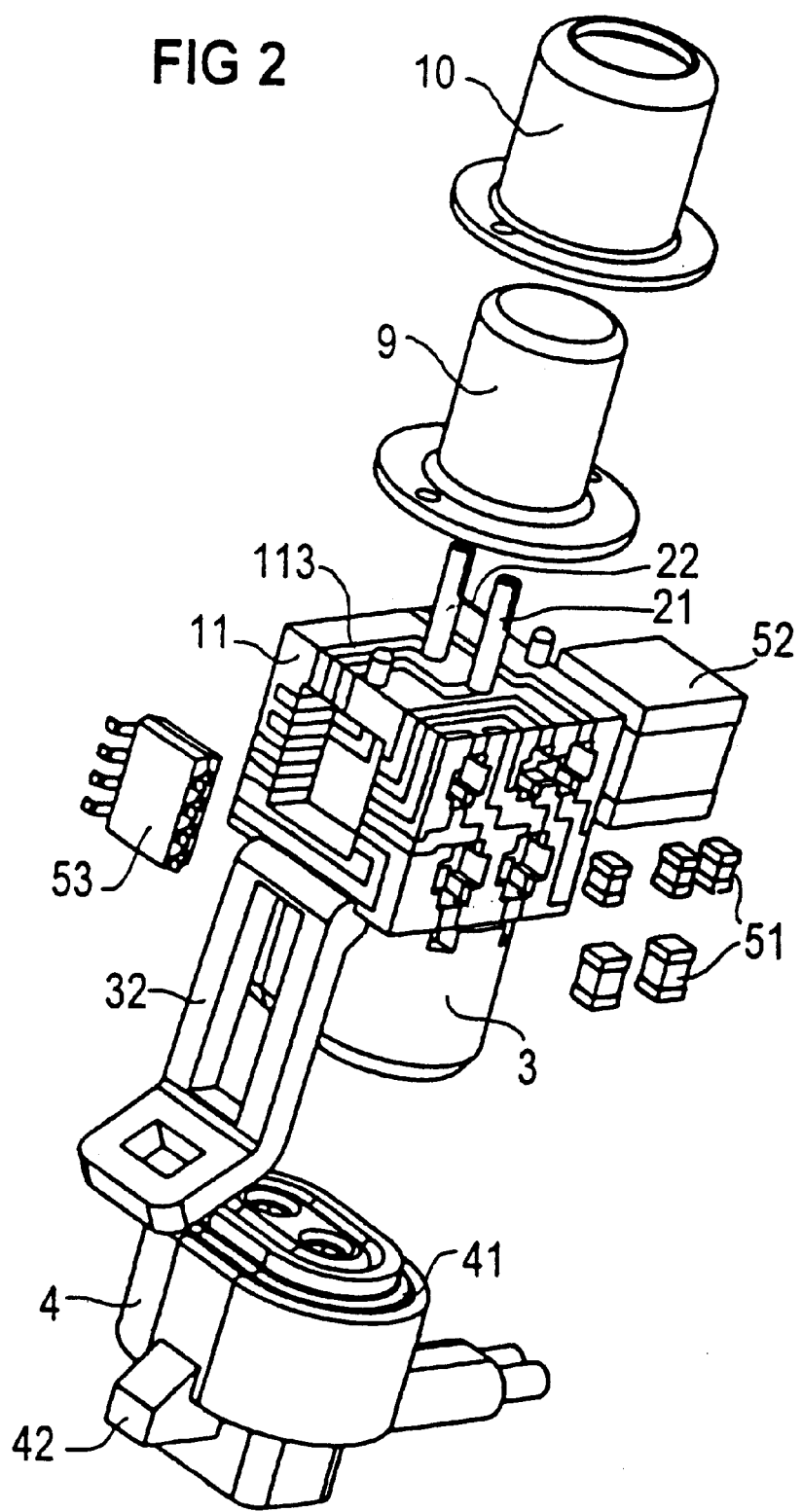
FIG. 2 is an exploded, perspective view of the detonator device of FIG. 1 with some already-assembled components, the mating plug, a metal cap, and a plastic cap.

FIG. 2 shows the detonator device of the invention as shown in FIG. 1, again with the plastic cap 9, the metal cap 10 and the mating plug 4. The plastic sheath 7 is not shown. The detonator device, with the components 51, 52 and 53, forms a structural unit together with the conductor tracks 113 applied to the plastic body 11, the plug body 3, the detent lug 42, the plug pins 31 and in particular the firing pins 21.

Figure 3:
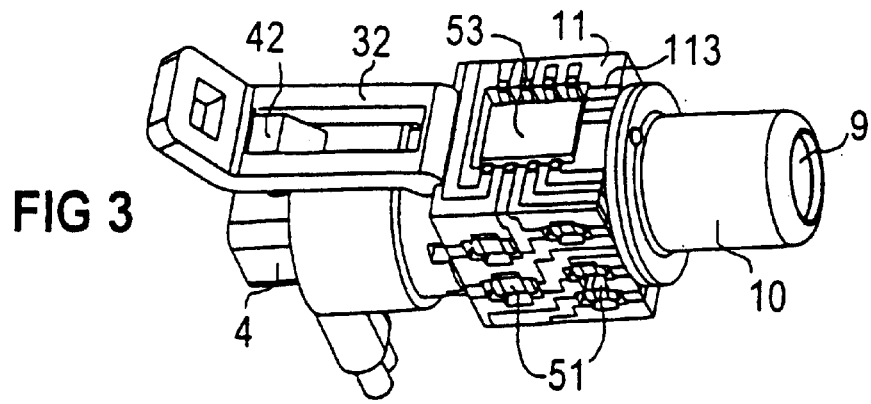
FIGS. 3 and 5 are perspective views of the completely assembled detonator device of FIG. 2 having additional components.

In FIG. 3, the detonator device of the invention is shown with the mating plug 4 and the plastic sheath 9 and the metal cap 10 in the put-together state. The components 51–53 are disposed in indentations in the plastic body 11, to save still further on installation space. The components 51–53 are electrically connected to one another and to the firing pins 21 and the plug pins 31, via the conductor tracks 113 on the plastic body 11.

Figure 4:
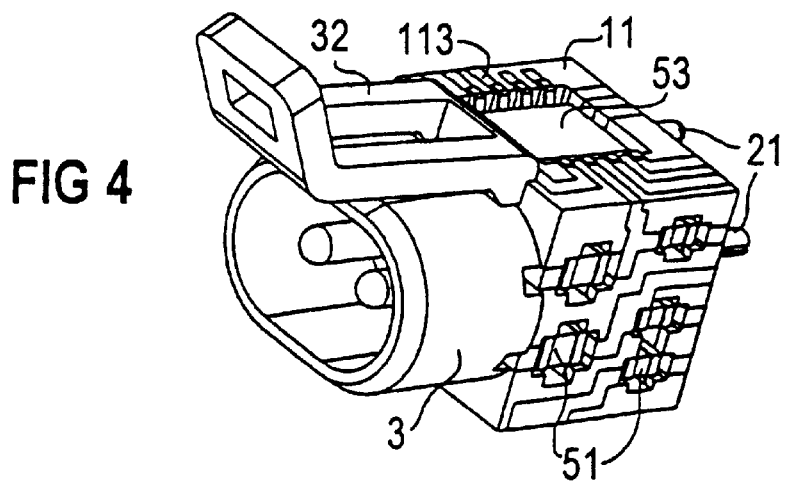
FIG. 4 is a perspective view of the completely assembled detonator device of FIG. 2.

FIG. 4 shows the detonator device in a perspective view.

Figure 5:
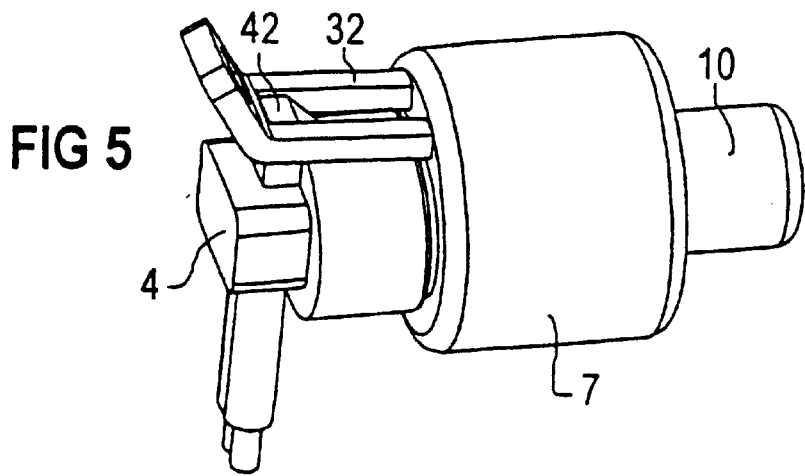

In FIG. 5, the detonator device is shown in perspective, both with the mating plug 4 and with the metal cap 10 and the plastic sheath 7.

Figure 6:
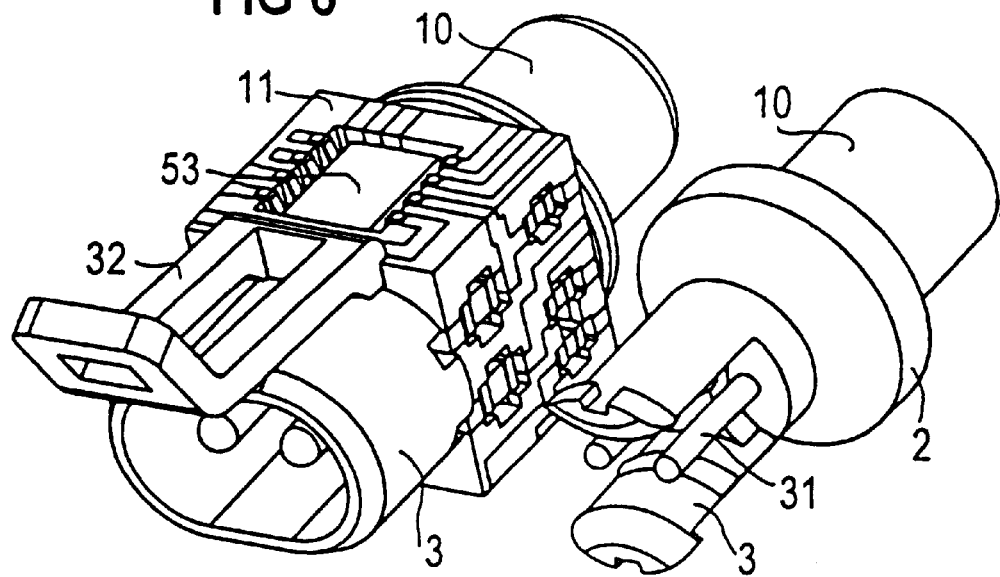
FIG. 6 is a perspective view of the detonator device with the plastic cap and the metal cap along with a known primer capsule.

In FIG. 6, the detonator device of the invention is shown without the mating plug 4 and without the plastic sheath 7, but with the metal cap 10, along with the conventional primer capsule 2 with the plug body 3 and the metal cap 10. It is clear from this that because of the structural form according to the invention of the detonator device, the dimensions of the conventional primer capsule 2 are only insignificantly exceeded, even though the detonator device includes the detonator circuit 5 with various components 51–53.

Figure 8:
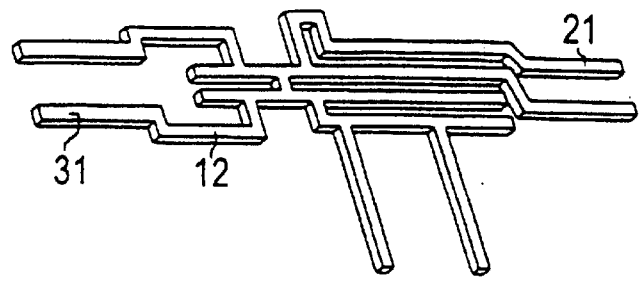
FIG. 8 is a perspective view of a conductor track structure configured as a holder for a detonator circuit.

FIG. 8 shows the conductor track structure 12, stamped out of a metal strip, as the holder for the detonator device of the invention. In the structure, the plug pins 31 and the firing pins 21 are integral components of the conductor track structure 12 and are thus jointly stamped out with it from the metal strip in a single operation.

Figure 9:
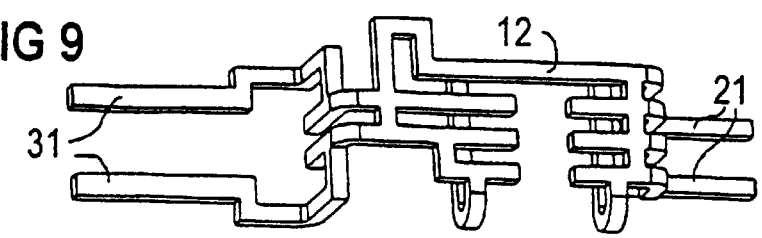
FIG. 9 is a perspective view of the conductor track structure of FIG. 8 bent into a three-dimensional circuit holder.

FIG. 9 shows the conductor track structure 12 of FIG. 1, with individual conductor courses being bent, to create a three-dimensional conductor track structure 12 which is especially compact and space-saving.

Figure 10:
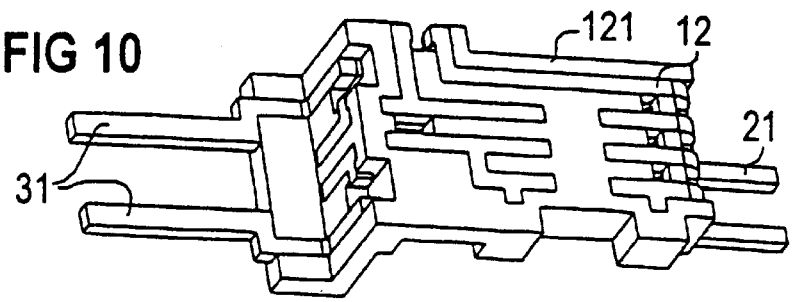
FIG. 10 is a perspective view of the conductor track structure of FIG. 9 spray-coated with plastic bridges.

In FIG. 10, the bent conductor track structure 12 of FIG. 9 is shown, in which individual conductor courses are joined to one another via plastic bridges 121. The plastic bridges 121 provide the conductor track structure 12 with sufficient mechanical stability. After individual conductor courses have been spray-coated with the plastic bridges 121, undesired conductive connections between the conductor courses can also be removed by stamping. The plastic bridges 121 also serve to receive and retain the electrical components 51–53.

Figure 11:
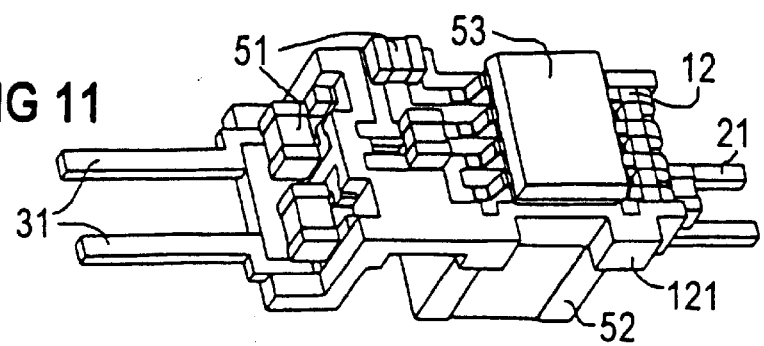
FIG. 11 is a perspective view of the spray-coated conductor track structure of FIG. 10 equipped with components.

FIG. 11 shows the conductor track structure 12 of FIG. 10 with mounted components, such as the integrated circuit 53, the energy-storing capacitor 52, or the other SMD components 51.

Figure 12:
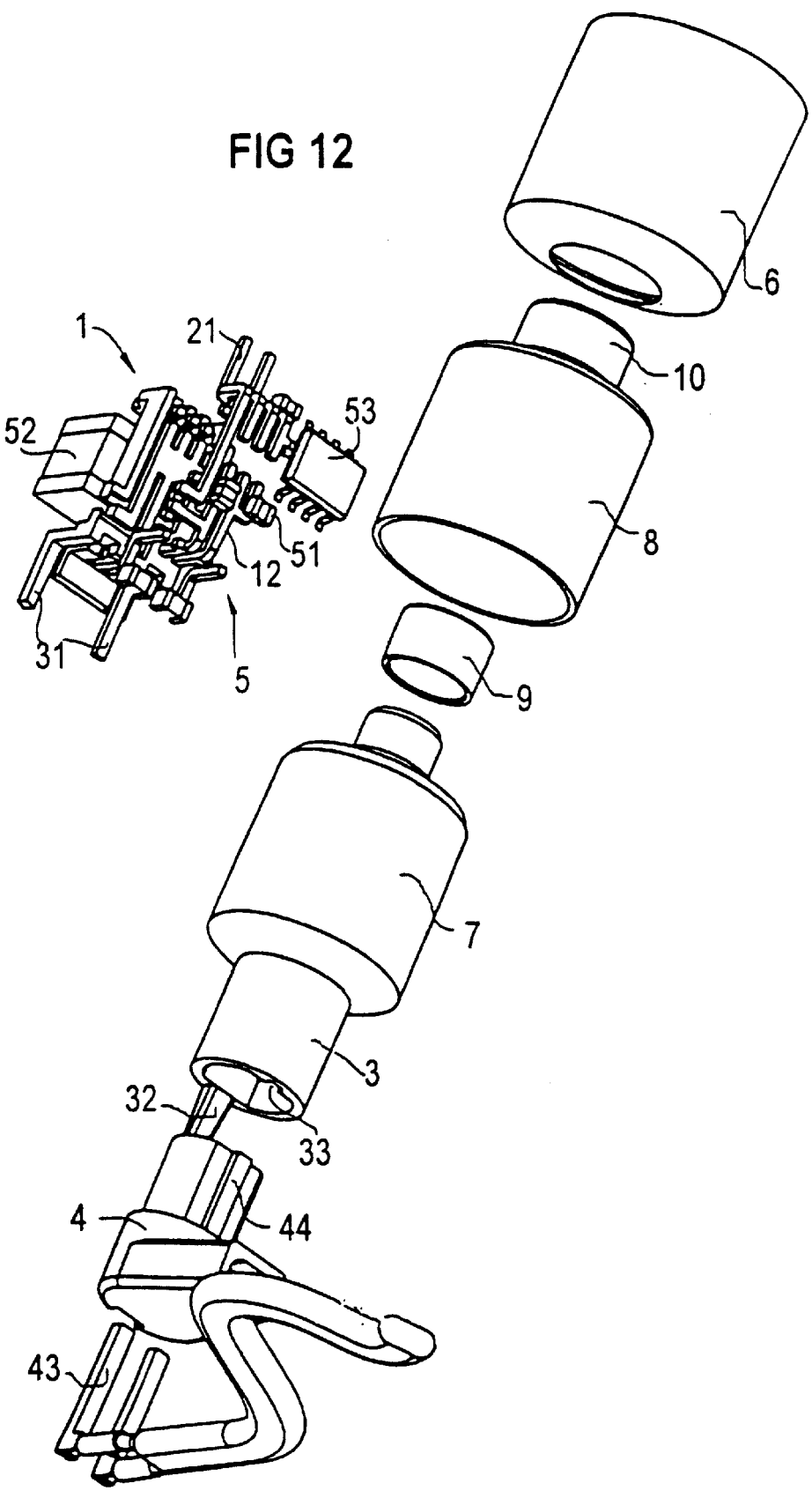
FIG. 12 an exploded, perspective view of the detonator device using stamped-grid technology with the mating plug and various sheaths.

In FIG. 12, the holder 1 with the stamped conductor track structure 12 that carries the detonator circuit 5 is shown in an exploded view, together with the various sheaths 6–10 and the mating plug 4. The conductor track structure 12 is spray-coated with plastic in such a way as to create the plastic sheath 7 that protects the detonator circuit 5 against environmental factors. Also, in the same operation, the plug body 3 is jointly sprayed onto the conductor track structure 12. The same is true for the detent hook 32 on the plug body 3. The plug body 3 also has a guide 33, which is engaged on the inside by a groove 44 of the mating plug 4, when the mating plug 4 has been inserted. Coding the plug connection in this way prevents the plug body 3 and mating plug 4 from being put together the wrong way.

The plastic sheath 7 is covered on its firing end with the plastic cap 9 for holding the detonating powder. The holder 1 with the plastic sheath 7, and the firing pins 21 sheathed with the plastic cap 9, are sheathed by the metal sheath 8 and the metal cap 10, which can certainly also be made integrally. This assures electromagnetic shielding of both the detonator circuit 5 and the firing pins 21, including the detonator wire 22. The metal sheaths 8, 10 also act as a heat dissipater during detonation. The gas generator sheath 6 is placed over the metal sheath 8 or the metal cap 10, and tablets for generating gas are located in its generator chamber.

Instead of the successive sheathing of the firing pins 21 on the one hand and the detonator circuit 5 itself on the other with the plastic sheath 7 and then the metal sheath 8, it is possible in both cases to replace the plastic and the metal sheaths 7 and 8 with a single plastic sheath. The sheathes have a first component including an insulating plastic and a second component including an electrically conductive, and hence a shielding, plastic. In particular, the plastic sheath 7 and the plastic cap 9, like the metal sheath 8 and the metal cap 10, may be made in one piece.

Spraying the plastic sheath 7 onto the holder 1 reinforces the mechanical stability of the detonator device. The plug body 3 may also be made integrally with the plastic sheath 7, instead of with the holder 1, 11, 12 and 21. The detonator device or the firing pins 21 can also first be sheathed by the metal sheath 8, 10, which is thereupon spray-coated in turn with plastic 7, 9, thus creating a plastic sheath for protecting against environmental factors.

According to the invention, the sheathing of the detonator device offers a simple way of fastening the gas generator. The mechanical connection between the plastic sheath and the gas generator sheath 6, or between the metal sheath 8 and the gas generator sheath 6, can be configured in such a way, via a flange, snap connection or other conventional connection, that when the detonating powder explodes, because of the great back-pressure, the detonator device is not separated from the gas generator, and thus the gas does not flow into the air bag but instead escapes to the outside. The entire gas generator housing can preferably also be made integrally with the sheathing of the detonator device, in order to assure a connection between these two components that is stable even under pressure.

FIG. 13 shows the detonator device of the invention as seen in FIG. 12, with the mating plug 4 and various sheaths 8–10, in the assembled state.

Advantageously, at least one metallized region or conductor track region of the holder 1 is located as close as possible to the metal sheath 8 surrounding the detonator device. The spacing between the metallized region and the metal sheath 8 is in each case less than the least spacing between the metal sheath 8, 10 and the firing pins 21 or the detonator wire 22. This assures that a major electrical charge located on the metal sheath 8, 10 or on the generator sheath 6, will not spark over to the firing pins 21 and thus cause a flow of current through the detonator wire 22 and possibly inadvertently igniting the detonating powder. By the aforementioned provision, the so-called spark path between the metal sheath 8, 10 and the metallized region on the holder 1 is shorter than the spark path between the metal sheath 8, 10 and the firing pins 21. Therefore, a charge from the metal sheath 8, 10 will spark over to the metallized region, but not to the firing pins 21. Unhindered conduction of the charge onward from the metallized region to the firing pins 21 is precluded by the intervening detonator circuit 5. The metallized region is preferably identical to the plug pins 31.

A plastic tub for holding the detonating powder is preferably jointly sprayed onto the holder 1 around the firing pins 21 as well.

We claim:

1. A detonator device for tripping a passenger restraint device in a motor vehicle, comprising:

an ignition element;

control electronics for controlling ignition of said ignition element; and a holder in the form of a three-dimensional plastic body, said holder supporting a three-dimensional conductor structure, said holder attached to said control electronics, said conducter structure holder having firing pins formed in one-piece therewith, said firing pins receiving and electrically connected to said ignition element, said firing pins being electrically connected to said control electronics through said conductor structure, said firing pins being partially surrounded by said holder thereby securing said firing pins.

2. The detonator device according to claim 1, wherein said ignition element is a detonator wire electrically connecting said firing pins.

3. The detonator device according to claim 1, wherein said conductor structure is a conductor track structure stamped out of a metal strip.

4. The detonator device according to claim 1, wherein said holder has conductor tracks applied thereto.

5. The detonator device according to claim 1, wherein said conductor structure has plug pins.

6. The detonator device according to claim 1, including a plastic sheath surrounding said holder.

7. The detonator device according to claim 1, including a metal sheath surrounding said holder.

8. The detonator device according to claim 7, wherein said holder has a metallized surface and a spacing between said metal sheath and said metallized surface of said holder is less than a spacing between said metal sheath and said firing pins.

* * * * *